United States Patent
Grötsch et al.

(10) Patent No.: US 9,964,270 B2
(45) Date of Patent: May 8, 2018

(54) OPTOELECTRONIC SEMICONDUCTOR COMPONENT AND ADAPTIVE HEADLIGHT FOR A MOTOR VEHICLE

(71) Applicant: OSRAM Opto Semiconductors GmbH, Regensburg (DE)

(72) Inventors: Stefan Grötsch, Bad Abbach (DE); Norbert Häfner, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days. days.

(21) Appl. No.: 15/032,502

(22) PCT Filed: Dec. 4, 2014

(86) PCT No.: PCT/EP2014/076602
§ 371 (c)(1),
(2) Date: Apr. 27, 2016

(87) PCT Pub. No.: WO2015/091005
PCT Pub. Date: Jun. 25, 2015

(65) Prior Publication Data
US 2016/0258588 A1    Sep. 8, 2016

(30) Foreign Application Priority Data

Dec. 20, 2013  (DE) .................. 10 2013 114 691

(51) Int. Cl.
*F21S 8/10*      (2006.01)
*H01L 25/075*   (2006.01)
(Continued)

(52) U.S. Cl.
CPC ......... *F21S 48/115* (2013.01); *F21S 48/1109* (2013.01); *F21V 23/005* (2013.01);
(Continued)

(58) Field of Classification Search
CPC ...... F21Y 2101/02; B60Q 1/18; B60Q 1/2607
(Continued)

(56) References Cited

U.S. PATENT DOCUMENTS 8,154,031 B2   4/2012   Grotsch et al.
8,344,659 B2   1/2013   Shimomura et al.
(Continued)

FOREIGN PATENT DOCUMENTS

DE   102005009060 A1   9/2006
DE   102011102032 A1   11/2012
(Continued)

*Primary Examiner* — Daniel St Cyr
(74) *Attorney, Agent, or Firm* — Slater Matsil, LLP

(57) ABSTRACT

An optoelectronic semiconductor component and an adaptive headlight are disclosed. In an embodiment an optoelectronic semiconductor component includes a carrier having a carrier top side and a carrier underside, a plurality of active zones, which are fitted at the carrier top side and which are designed for emitting radiation, electrical contact locations at the carrier underside, which are designed for electrically connecting the semiconductor component and a drive unit for electrically addressing the semiconductor component and for electrically driving the active zones, wherein the active zones are fitted in a regular grid at the carrier top side, wherein the grid has a grid pitch, wherein geometrical midpoints of radiation main sides of the active zones lie on grid points of the grid, and wherein a distance between the geometrical midpoints of marginal active zones and a closest edge of the carrier is at most 50% of the grid pitch.

11 Claims, 4 Drawing Sheets

(51) Int. Cl.
- H01L 25/16 (2006.01)
- F21V 23/00 (2015.01)
- F21V 23/04 (2006.01)
- H01L 33/48 (2010.01)
- H01L 27/15 (2006.01)
- H01L 33/50 (2010.01)
- H01L 33/56 (2010.01)
- H01L 33/60 (2010.01)
- F21Y 101/00 (2016.01)

(52) U.S. Cl.
CPC .......... *F21V 23/04* (2013.01); *H01L 25/0753* (2013.01); *H01L 25/167* (2013.01); *H01L 33/486* (2013.01); *F21Y 2101/00* (2013.01); *H01L 27/156* (2013.01); *H01L 33/505* (2013.01); *H01L 33/56* (2013.01); *H01L 33/60* (2013.01); *H01L 2224/48091* (2013.01); *H01L 2924/0002* (2013.01)

(58) Field of Classification Search
USPC .................. 362/543, 544, 545, 549
See application file for complete search history.

(56) References Cited

U.S. PATENT DOCUMENTS

| | | | |
|---|---|---|---|
| 8,415,680 B2 | 4/2013 | Ogihara et al. | |
| 8,436,373 B2 | 5/2013 | Mizutani et al. | |
| 8,773,006 B2 | 7/2014 | Kim et al. | |
| 8,936,381 B2 * | 1/2015 | Luger | F21S 48/1154 362/538 |
| 8,944,656 B1 * | 2/2015 | Chen | B60Q 1/18 362/497 |
| 8,974,099 B2 * | 3/2015 | Morgenstern | B60Q 1/1415 362/235 |
| 9,362,335 B2 | 6/2016 | von Malm | |
| 9,589,080 B2 | 3/2017 | Rentschler et al. | |
| 2010/0201610 A1 | 8/2010 | Lo et al. | |
| 2010/0320479 A1 | 12/2010 | Minato et al. | |
| 2011/0254034 A1 | 10/2011 | Konsek et al. | |
| 2012/0018745 A1 | 1/2012 | Liu et al. | |
| 2014/0098556 A1 | 4/2014 | von Malm et al. | |
| 2015/0014716 A1 | 1/2015 | von Malm et al. | |
| 2015/0279902 A1 | 10/2015 | Von Malm et al. | |
| 2015/0319814 A1 | 11/2015 | Grotsch et al. | |
| 2015/0325598 A1 | 11/2015 | Pfeuffer et al. | |
| 2016/0258588 A1 | 9/2016 | Grötsch et al. | |

FOREIGN PATENT DOCUMENTS

| | | |
|---|---|---|
| DE | 10201011102032 A1 | 11/2012 |
| DE | 102011056888 A1 | 6/2013 |
| DE | 102012101160 A1 | 8/2013 |
| DE | 102012109460 A1 | 4/2014 |
| DE | 102012111247 A1 | 5/2014 |
| DE | 102012112302 A1 | 6/2014 |
| JP | 2003092428 A | 3/2003 |
| JP | 2003150120 A | 5/2003 |
| JP | 2006269967 A | 10/2006 |
| JP | 2007048773 A | 2/2007 |
| JP | 2007165791 A | 6/2007 |
| JP | 2008124153 A | 5/2008 |
| JP | 2010010476 A | 1/2010 |
| JP | 2013046072 A | 3/2013 |
| JP | 2013101396 A | 5/2013 |
| JP | 2013527452 A | 6/2013 |
| JP | 2013527482 A | 6/2013 |
| JP | 2013171942 A | 9/2013 |
| JP | 2013197439 A | 9/2013 |
| JP | 2015501085 A | 1/2015 |
| WO | 2015091005 A1 | 6/2015 |

\* cited by examiner

OPTOELECTRONIC SEMICONDUCTOR COMPONENT AND ADAPTIVE HEADLIGHT FOR A MOTOR VEHICLE

This patent application is a national phase filing under section 371 of PCT/EP2014/076602, filed Dec. 4, 2014, which claims the priority of German patent application 10 2013 114 691.0, filed Dec. 20, 2013, each of which is incorporated herein by reference in its entirety.

TECHNICAL FIELD

An optoelectronic semiconductor component is specified. Furthermore, an adaptive headlight for a motor vehicle is specified.

SUMMARY

Embodiments provide an optoelectronic semiconductor component which is efficiently driveable and arrangeable.

In accordance with at least one embodiment, the optoelectronic semiconductor component comprises a carrier. The carrier has a carrier top side and a carrier underside opposite the latter. The carrier top side and the carrier underside are in each case main sides and, in particular, planar. The carrier is preferably the component part that mechanically stabilizes the semiconductor component, such that the semiconductor component would be mechanically unstable without the carrier. By way of example, the carrier is a so-called submount.

In accordance with at least one embodiment, the semiconductor component comprises a plurality of active zones. The active zones are designed for emitting a radiation during the operation of the semiconductor component. By way of example, visible light, in particular blue light or white light or yellow light or orange light or red light, is generated in the active zones.

In accordance with at least one embodiment, the active zones are fitted at the carrier top side. The active zones can be in contact with the carrier top side or, preferably, can be fitted in a manner spaced apart from the carrier top side.

In accordance with at least one embodiment, the active zones are in each case integrated in a semiconductor layer sequence or in an optoelectronic semiconductor chip. By way of example, each of the active zones is a radiation-generating region in a semiconductor chip, in particular in a light emitting diode or in a laser diode. In this case, the active zones and/or the semiconductor chips preferably comprise or consist of at least one semiconductor layer sequence.

The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or else an arsenide compound semiconductor material such as $Al_nIn_{1-n-m}Ga_mAs$, wherein in each case $0 \leq n \leq 1$, $0 \leq m \leq 1$ and $n+m \leq 1$. In this case, the semiconductor layer sequence can comprise dopants and additional constituents. For the sake of simplicity, however, only the essential constituents of the crystal lattice of the semiconductor layer sequence, that is to say Al, As, Ga, In, N or P, are indicated, even if these can be replaced and/or supplemented in part by small amounts of further substances.

In accordance with at least one embodiment, the semiconductor component comprises at least three electrical contact locations at the carrier underside. By way of example, the semiconductor component comprises exactly three or exactly four of the electrical contact locations. The electrical contact locations are designed at least for electrically connecting the semiconductor component. It is likewise possible for the electrical contact locations to be designed for mechanically fixing and/or for thermally linking the semiconductor component to an external component part. The contact locations are intended for soldering or for electrically conductive adhesive bonding, for example.

In accordance with at least one embodiment, the semiconductor component comprises at least one drive unit. The drive unit is preferably designed for electrically addressing the semiconductor component and/or for electrically driving the active zones. In particular, the drive unit is a so-called microcontroller.

In accordance with at least one embodiment, the active zones are fitted in a regular grid at the carrier top side, as seen in plan view. By way of example, the active zones are arranged in a matrix-type fashion. The grid can be a rectangular grid or a square grid. The grid has at least one grid pitch. In the case of a square grid, the grid pitch corresponds to a distance between adjacent grid points along a shortest connecting line. If the grid is a rectangular grid, for example, then the grid can have two grid pitches. The at least one grid pitch and the grid preferably extend uniformly over the entire carrier top side.

In accordance with at least one embodiment, the active zones have a geometrical midpoint at a radiation main side facing away from the carrier, as seen in plan view. In the case of square or rectangularly shaped radiation main sides, the geometrical midpoint is, in particular, an intersection point of diagonals of the radiation main side.

In accordance with at least one embodiment, the midpoints of the radiation main sides lie on the grid points of the grid, as seen in a plan view particularly of the carrier top side and/or of the radiation main sides. A tolerance with which the geometrical midpoints lie on the grid points as seen in plan view is preferably at most 30% or 20% or 10% or 5% of the grid pitch or of an average grid pitch. Such relatively small deviations of the position of the geometrical midpoints from the grid points are attributable to mounting tolerances, in particular. Particularly preferably, there is no intended deviation between a position of the geometrical midpoints and the grid points.

In accordance with at least one embodiment, a distance D between the geometrical midpoints of marginal active zones and a closest edge of the carrier is at most 60% of the grid pitch M, as seen in plan view. Preferably, said distance is at most 50% or 45% or 40% and/or at least 15% or 25% or 30%. In this case, marginal means that the corresponding active zone does not have a further active zone adjacent to it in a direction toward the closest edge and adjoins no active zone, toward the closest edge. Alternatively or additionally, the following holds true for the distance D depending on the grid pitch M: $(M-0.3 \text{ mm})/2 \leq D \leq (M-0.1 \text{ mm})/2$.

According to at least one embodiment, the optoelectronic semiconductor component comprises a carrier having a carrier top side and having a carrier underside. A plurality of active zones are fitted at the carrier top side and are designed for generating and emitting radiation. At least three electrical contact locations are situated at the carrier underside and are designed for electrically and/or mechanically and/or thermally connecting the semiconductor component. The semiconductor component furthermore comprises at least one drive unit for electrically addressing the semiconductor component and for electrically driving the active zone. In this case, the active zones are fitted in a regular grid having a grid pitch at the carrier top side, as seen in plan view. Geometrical midpoints of radiation main sides of the active zones lie on grid points of the grid, with a tolerance of at most 20% of the grid pitch. In this case, a distance between the geometrical midpoints of marginal active zones and a closest edge of the carrier is at most 60%, preferably at most 50%, of the grid pitch.

Particularly in automotive engineering, a trend toward ever higher resolutions can be observed especially in the case of adaptive front headlight systems. If individual light emitting diode components having in each case two connections, for an anode and for a cathode, are arranged in a matrixlike fashion, then an interconnection outlay is relatively high. Moreover, an arrangement of a multiplicity of light emitting diode components is susceptible to faults during mounting. Moreover, an arrangement density is restricted owing to the space required for conductor tracks. A size of the conductor tracks is downwardly limited in this case on account of the relatively high current demand of the light emitting diode components; the conductor tracks must have a comparatively large cross section.

In the case of the semiconductor components described here, a plurality of active zones or a plurality of semiconductor chips designed for generating radiation are integrated on a common carrier and are addressable in a targeted manner by means of the drive unit. Particularly by virtue of the fact that a distance of the geometrical midpoints toward a margin is smaller than a grid pitch, a uniform arrangement of the active zones across a plurality of the semiconductor components is made possible.

In accordance with at least one embodiment, the grid is an n×m matrix. Here n, m are in each case natural numbers greater than or equal to 2, greater than or equal to 3 or greater than or equal to 4. Alternatively or additionally, n, m are at most 32 or 25 or 12 or 8 or 6.

In accordance with at least one embodiment, the semiconductor component is designed to be surface-mountable. In other words, the semiconductor component is then fixable to an external carrier by surface mount technology, or SMT for short.

In accordance with at least one embodiment, in each case one or a plurality of conversion elements is or are assigned to some or all of the active zones. In particular, the conversion elements are situated at a side of the active zones facing away from the carrier. The at least one conversion element can be embodied as a lamina or as a potting and is designed for completely or partly converting radiation generated in the associated active zone. By way of example, part of a blue light generated in the active zone is converted into yellow light by means of the conversion element, thus resulting in white light.

In accordance with at least one embodiment, the conversion elements in each case completely cover the radiation main sides, as seen in a plan view of the carrier top side. In this case, the conversion elements can each be arranged congruently with respect to the associated active zone or else project beyond the associated active zone all around. Alternatively, it is possible for the conversion elements, as seen in plan view, each to be smaller than the active zones and for the active zones to project beyond said conversion elements. Moreover, a single conversion element can cover all the active zones.

In accordance with at least one embodiment, the active zones and/or the conversion elements, as seen in plan view, are surrounded all around by a reflector potting. The reflector potting can be a material which appears white to an observer. Preferably, the reflector potting surrounds the conversion element in a positively locking manner and in direct contact, in a direction parallel to the carrier top side.

In accordance with at least one embodiment, an average distance between adjacent active zones and/or between adjacent semiconductor chips is at most 70% or 45% or 30% or 20% of the grid pitch. In this case, the average distance should preferably be determined in a direction parallel to the carrier top side. In other words, the semiconductor chips and/or the active zones are arranged at a small distance from one another and densely on the carrier top side.

In accordance with at least one embodiment, the carrier is a silicon carrier or a germanium carrier. In other words, the carrier is then formed from a semiconductor material or comprises such a semiconductor material. In this case, further layers, in particular electrically insulating layers or metallic conductor tracks, can be fitted to the carrier.

In accordance with at least one embodiment, the drive unit is monolithically integrated in the carrier. This means, in particular, that the drive unit is not a separate component part applied to the carrier subsequently. In that case no connecting medium is situated between the carrier and the drive unit. By way of example, the drive unit is then grown in or with the carrier and/or produced by means of implantation of ions in the carrier.

In accordance with at least one embodiment, the drive unit comprises one or a plurality of transistors and/or electrical switches. In this case, the switches and/or transistors can be based on silicon or germanium and comprise corresponding dopings.

In accordance with at least one embodiment, the drive unit is formed by a layer composed of recrystallized silicon or comprises at least one such layer. The transistors and/or switches can be embodied into this layer.

In accordance with at least one embodiment, the drive unit, in particular the at least one layer composed of recrystallized silicon, is situated at the carrier top side or at the carrier underside. Preferably, the drive unit is then fitted between the carrier and the active zone. It is possible for the active zones to be electrically and/or mechanically in contact with the carrier solely via the drive unit.

In accordance with at least one embodiment, the drive unit comprises or is a serial shift register. The shift register has preferably one, in particular exactly one, data input and one or a plurality of signal outputs. The signal outputs are preferably electrically connected to the active zones and/or the semiconductor chips. In particular, the signal outputs are electrically conductively connected to switches, wherein each of the switches is electrically connected in parallel with one of the active zones and/or semiconductor chips.

In accordance with at least one embodiment, exactly one electrical contact pad for a voltage line or a voltage supply or a current supply is fitted at the carrier underside. Alternatively or additionally, exactly one electrical contact pad for a ground line or a ground contact is situated at the carrier underside. Furthermore, one or two or more than two contact pads for a data line can be situated at the carrier underside. Preferably, exactly two contact pads for a data line, namely one contact pad for a data input and one contact pad for a data output, are fitted at the carrier underside.

In accordance with at least one embodiment, different active zones and/or different semiconductor chips are designed for generating radiation having mutually different spectral compositions. A color impression of the radiation emitted by the semiconductor component is adjustable in this way.

In accordance with at least one embodiment, all the active zones and/or semiconductor chips of the semiconductor component are designed to emit light of the same color during operation. In this case, a color of the light that is emitted by a specific active zone and/or by a specific semiconductor chip is preferably defined and thus not adjustable. By way of example, the semiconductor component is then designed solely to emit white light as a headlight or only orange light as a flashing indicator or only red light as a brake light.

In accordance with at least one embodiment, at least a plurality of the active zones, which are based in particular on a semiconductor layer sequence, in the semiconductor component have a common growth substrate. The semiconductor layer sequence is grown on the growth substrate. The active zones then have in each case the same material composition and the same layer thicknesses in the semiconductor layer sequence.

In accordance with at least one embodiment, a semiconductor material from which the active zones are constructed is completely or partly removed between adjacent active zones. A structuring with respect to the active zones is carried out in this case by an etching, for example. A process of subsequently changing relative positions of the active zones with respect to one another, after growth of the semiconductor layer sequence, is then preferably not carried out.

Furthermore, an adaptive headlight is specified. The headlight is, in particular, a headlight for a motor vehicle, for instance an automobile front headlight. The headlight comprises a plurality of semiconductor components as specified in association with at least one of the embodiments mentioned above. Therefore, features of the semiconductor components are also disclosed for the headlight, and vice versa.

In at least one embodiment, the semiconductor components are fitted on a mounting platform, in particular on a common and integral mounting platform. In this case, the semiconductor components are arranged on the mounting platform in such a way that all the active zones of all the semiconductor components or of at least a plurality of the semiconductor components lie on the grid points of the regular grid, with a tolerance of at most 20% or 10% or 5% of the grid pitch. In this case, the geometrical midpoint of the radiation main side is preferably used as the position of the respective active zones. In this case, the grid extends uniformly over all or over at least a plurality of the semiconductor components. In this case, it is not absolutely necessary for the mounting platform to be shaped in a planar fashion.

In accordance with at least one embodiment, a plurality or all of the semiconductor components are connected to one another via at least one common data line. In particular, a plurality of the semiconductor components are connected to one another via exactly one common data line. The term common data line does not rule out the data line being looped through individual semiconductor components or through all of the semiconductor components. In other words, the data line need not be a single, physically continuous data line or conductor track.

In accordance with at least one embodiment, individual active zones or groups of active zones of the headlight are driveable independently of one another by means of the drive unit. This preferably also holds true within the respective semiconductor components. As a result, an illumination region in which the headlight emits radiation is electronically purposefully adjustable and variable.

In accordance with at least one embodiment, a plurality of the semiconductor components or all of the semiconductor components are connected to one another via a common voltage line and/or via a common ground line. In particular, it is not necessary for a dedicated voltage line to be present for each of the semiconductor components.

BRIEF DESCRIPTION OF THE DRAWINGS

An optoelectronic semiconductor component described here and a headlight described here are explained in greater detail below on the basis of exemplary embodiments with reference to the drawing. In this case, identical reference signs indicate identical elements in the individual figures. In this case, however, relations to scale are not illustrated; rather, individual elements may be illustrated with an exaggerated size in order to afford a better understanding.

In the figures.

DETAILED DESCRIPTION OF ILLUSTRATIVE EMBODIMENTS

Figure 1:
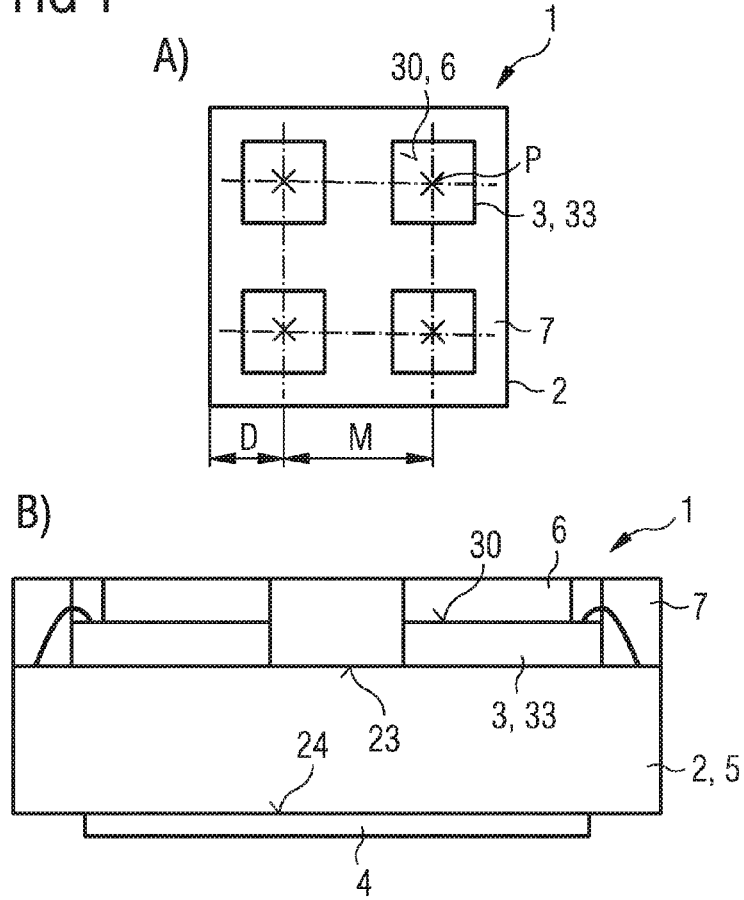
FIGS. 1 and 3 show schematic illustrations of exemplary embodiments of optoelectronic semiconductor components described here.

FIG. 1A shows a schematic plan view and FIG. 1B a schematic sectional illustration of an exemplary embodiment of an optoelectronic semiconductor component 1.

The semiconductor component 1 comprises a carrier 2. A plurality of electrical contact locations 4 are fitted at a carrier underside 24. A plurality of optoelectronic semiconductor chips 3 each having exactly one active zone 33 for generating visible light are arranged at a carrier top side 23 opposite the carrier underside 24. Electrical plated-through holes and an electrical circuit between the contact locations 4 and the semiconductor chips 3 are not depicted, in order to simplify the illustration.

The semiconductor chips 3 are arranged in a 2×2 matrix. For addressing the semiconductor component 1 and for purposefully driving individual semiconductor chips 3, a drive unit 5 is monolithically integrated in the carrier 2. The drive unit 5 is a microcontroller, in particular. For this purpose, the carrier 2 is a silicon carrier, for example. The drive unit 5 then preferably comprises a register, a plurality of transistors and switches. The drive unit 5 has been produced using silicon technology.

As seen in plan view, radiation main sides 30 of the semiconductor chips 3 in each case have a geometrical midpoint P. The midpoints P are situated at grid points of a grid. The grid is symbolized by dash-dotted lines. A grid pitch M, corresponding to a shortest distance between adjacent grid points, corresponds here maximally to double a distance D between the geometrical midpoints P and a respectively closest edge of the carrier 2, as seen in plan view. Consequently, a distance between adjacent semiconductor chips 3 within the semiconductor component 1, as seen in plan view, is significantly greater than a distance between the marginal semiconductor chips 3 and the edge.

Figure 2:
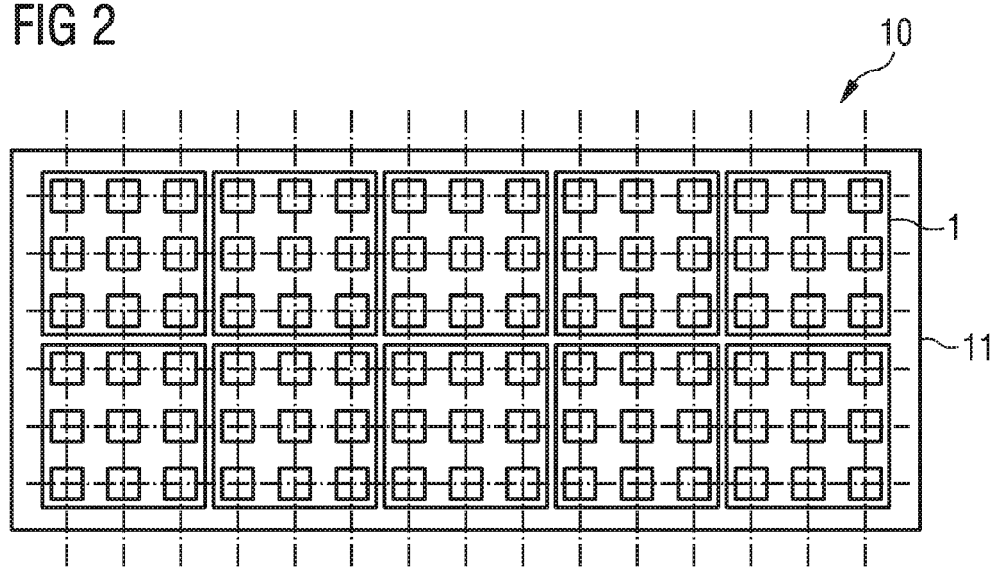
FIGS. 2, 4 and 5 show a schematic illustration of exemplary embodiments of adaptive headlights described here.

As a result, it is possible to construct a larger arrangement of a plurality of semiconductor components by virtue of the grid remaining constant across all the semiconductor components 1, see the plan view of an adaptive headlight 10 in FIG. 2. Since a plurality of the semiconductor chips 3 are combined to form a common semiconductor component 1, the electrical contact pads 4 of the semiconductor component 1 can furthermore be shaped such that they are larger than would be the case for individual semiconductor chips.

Even in the case of a plurality of the semiconductor chips 3 in the semiconductor component 1 even without the drive unit 5, this can result in a reduced number of contact locations 4, since, instead of 2i contacts, only i+1 contacts for the i semiconductor chips 3 are required in the semiconductor component 1. The description given here in relation to the semiconductor component 1 can therefore be correspondingly applied to modifications without a drive unit, in particular in relation to the arrangement of the semiconductor chips 3 and/or the active zones 33.

Optionally, as also in all the other exemplary embodiments, the semiconductor chips 3 and/or the active zones 33 and the conversion elements 6 in accordance with FIG. 1 are surrounded with a reflector potting 7 in a direction parallel to the carrier top side 23. The reflector potting 7 is a silicone, for example, and mixed with reflective particles composed, for example, of titanium dioxide. The reflective potting 7 can terminate flush with the carrier 2 in a direction parallel to the carrier top side 23. In a direction away from the carrier 2, the conversion elements 6 and the reflector potting 7 preferably likewise terminate flush with one another. Bonding wires for contacting the semiconductor chips 3 and/or the active zones 33 can be completely embedded in the reflector potting 7.

As an alternative to the housing design in FIG. 1, a housing based on a ceramic can also be used. Housings having a leadframe could likewise be used, for example, of the "tape+reel" type or for short APF or Advanced Patterning Film or of the film-based leadframe type, for instance on the basis of copper films, in particular QFN housing designs. Furthermore, it is possible to use molded housing shapes particularly with a metallization produced electrolytically, especially in the form of CiF designs or chip-in-frame designs. These alternative housing shapes can also be used in all the other exemplary embodiments.

A further exemplary embodiment of the semiconductor component 1 can be seen in the plan view in accordance with FIG. 3A and in the bottom view in accordance with FIG. 3B. In this case, the semiconductor chips 3 are arranged in a 2×3 matrix. The thus six semiconductor chips 3 have a common contact location for a ground contact GND and a common contact location for a voltage line VCC. Furthermore, two contact locations 4 for a data line 8 are provided, divided into one contact location Din for a data input and one contact location Dout for a data output. In a departure from the illustration in accordance with FIG. 3B, the contact locations 4 can also be positioned differently, such that, for example, the contact locations Din and Dout are not situated between the contact locations GND and VCC.

Figure 3:
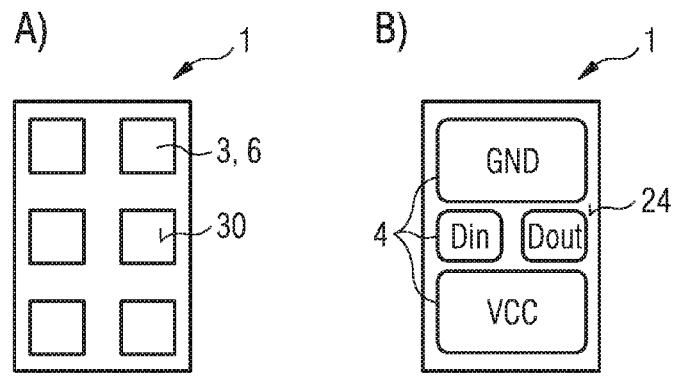
Figure 4:
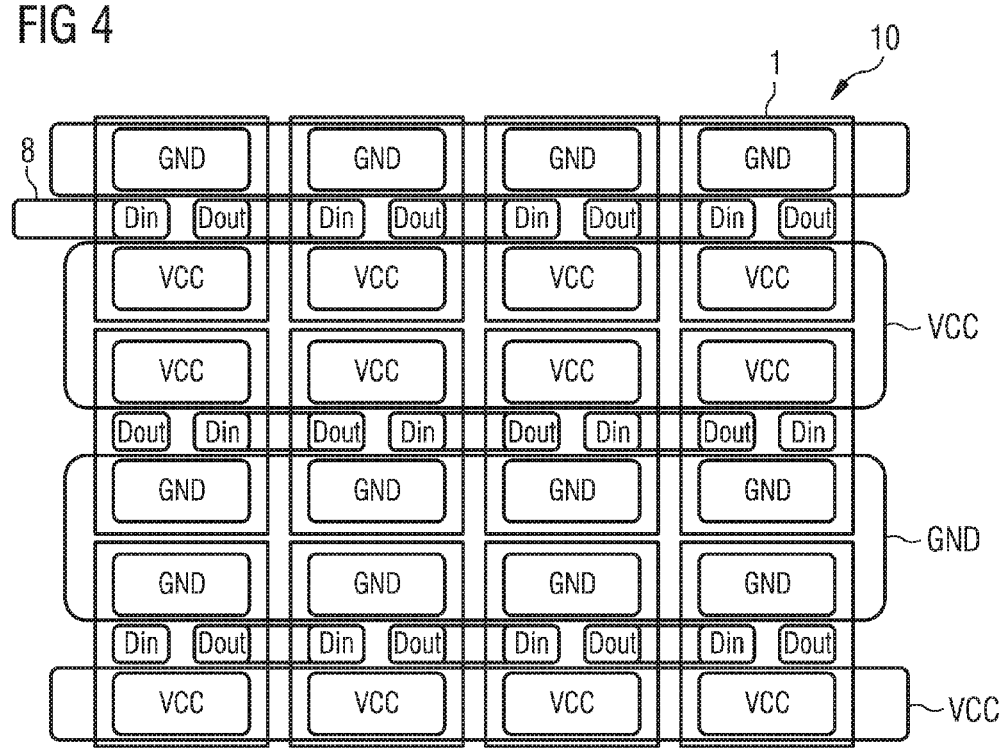

A corresponding arrangement in a headlight 10 comprising a plurality of the semiconductor components 1, in particular as shown in FIG. 3, is illustrated in a schematic bottom view in FIG. 4.

In this case, adjacent contact locations for the data input Din and the data output Dout of adjacent semiconductor components 1 are always at the same potential. As a result, a distance between adjacent semiconductor components 1 can be reduced since it is not necessary to comply with potential-dictated distances on the mounting platform 11. The voltage line VCC and the ground line GND can also be combined differently over a plurality of the semiconductor components 1, in a departure from the illustration in accordance with FIG. 4.

A processing of the data set with which the individual semiconductor components 1 are driven, hierarchical interconnection levels and conductor tracks at the mounting platform 11 are in each case not illustrated, for the sake of simplification. Optionally, in the drive units 5, not shown in FIG. 4, further information or drive data can also be processed or included, for example, a lifetime-dependent correction of the operating voltage or a temperature-dependent fuse. A detection of short circuits can also be implemented at the mounting platform 11 or in the individual semiconductor components 1.

As also in all the other exemplary embodiments, it is possible for the data line 8 to be a data bus having one or a plurality of lines. A number of the contact pads 4 can be correspondingly adapted to the number of lines of the data bus. For example, the data bus has a line for the input data, a line for the output data and a line for a time signal, referred to as clock. The time signal can likewise be transported by a line for the output data and/or by a line for the input data. Furthermore, the time signal, the input data and the optional output data can be transported by just a single line.

Circuit structures for the drive unit 5 and designs for the driving of the semiconductor components 1 can be gathered from the document DE 10 2012 111 247 A1, for example. The disclosure content of said document is incorporated by reference.

Figure 5:
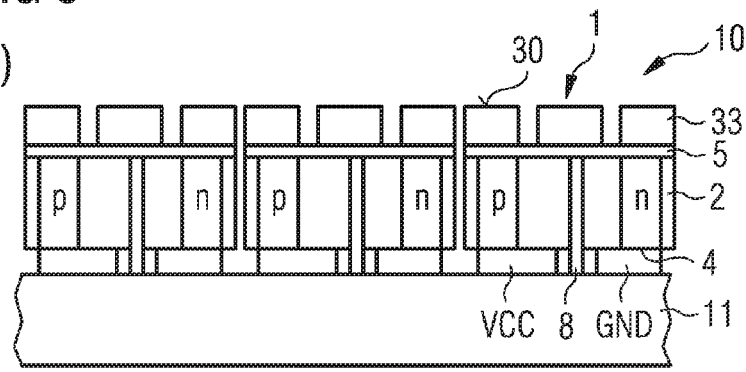
Figure 5:
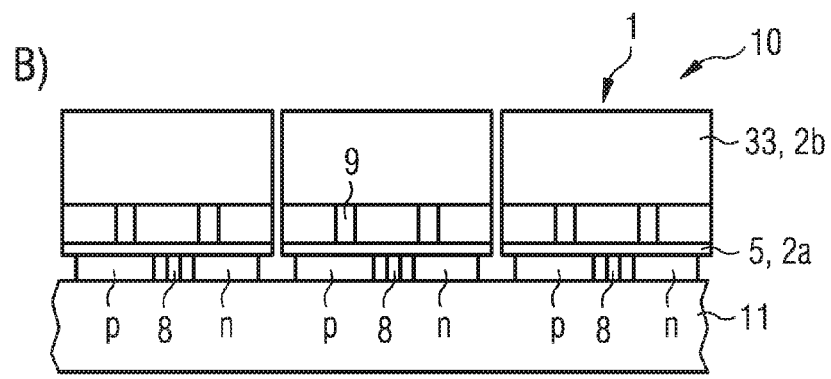
Figure 5:
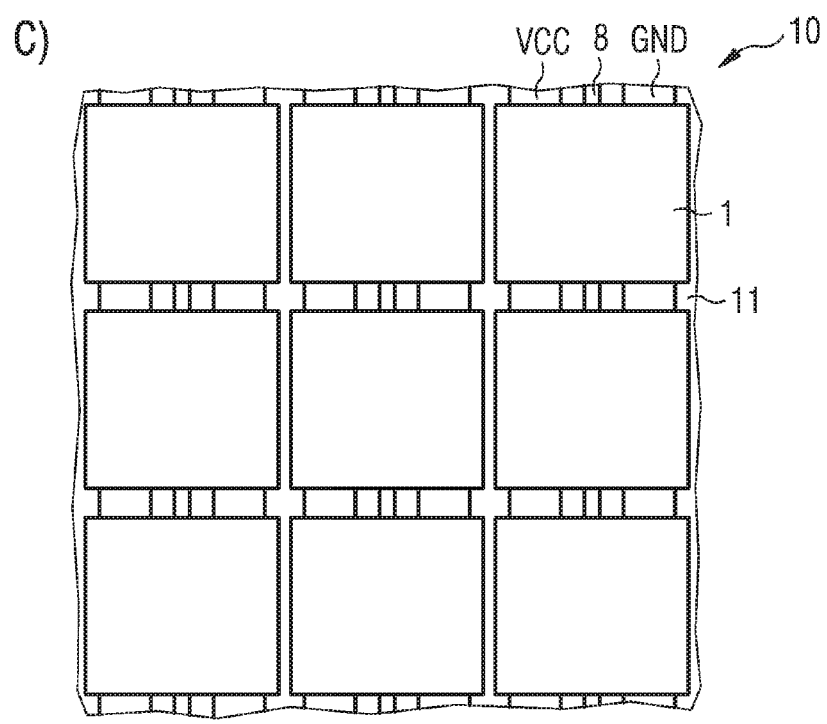

FIG. 5 illustrates further exemplary embodiments of the headlight 10. In accordance with the sectional illustration in FIG. 5A, the semiconductor components 1 each comprise a carrier 2 provided with plated-through holes. For example, a p-side contact-connection is connected to the voltage line VCC and an n-side contact-connection is connected to the ground line GND.

The drive unit 5 is situated in each case between the active zones 33 and the carrier 2. The drive unit 5 is formed from one or a plurality of layers of recrystallized silicon. In this case, the silicon is produced in an amorphous fashion by means of vapor deposition, for example, and the recrystallization is brought about by scanning by means of an intensive laser beam, for instance. Such a silicon layer can have an increased charge carrier mobility, in particular between 400 cm$^2$/Vs and 500 cm$^2$/Vs. Furthermore, such a silicon layer can be deposited at comparative moderate temperatures of less than 400° C. It is thus possible that the drive unit 5 can be produced only after the production of the structures for the active zones 33. In contrast to the illustration shown, it is also possible for the active zones 33 to be electrically contacted at least partly by means of conductor tracks and by means of electrical contact locations at the radiation main side 30.

In accordance with the sectional illustration in FIG. 5B, an isolation 9 is in each case fitted between adjacent active zones 33. The isolation 9 is preferably both an electrical isolation and an optical isolation. In contrast to the illustration shown, such an isolation 9 can also serve for laterally delimiting the respective semiconductor components 1 at outer side surfaces of the active zones 33. The drive unit 5 is formed at a side of the active zones 33 facing away from a growth substrate 32 of the active zones 33, for example, by means of a recrystallized silicon layer, as explained in association with FIG. 5A. A planarization between the active zones 33 toward the drive unit 5 is achievable by virtue of the isolation 9.

A carrier function in accordance with FIG. 5B is provided, for example, from the combination of the drive unit 5 together with the common growth substrate 32. Optionally, however, it is likewise possible for the growth substrate 32 to be completely removed from the active zones 33, as also in all the exemplary embodiments.

Such active zones 33 in conjunction with such a drive unit 5 can be constructed and produced, for example, as specified in association with the documents DE 10 2012 109 460 A1 or DE 10 2012 112 302 A1. The disclosure content of these documents with regard to fitting the active zones 33 to the drive unit 5 is incorporated by reference.

The electrical interconnection of the optoelectronic semiconductor components 1 is depicted schematically in a schematic plan view of the headlight 10, see FIG. 5C. In contrast to the illustration shown, it is also possible for all the semiconductor components 1 each to be applied on a single, continuous line for the voltage VCC, for ground GND and for the data signal 8.

Figure 6:
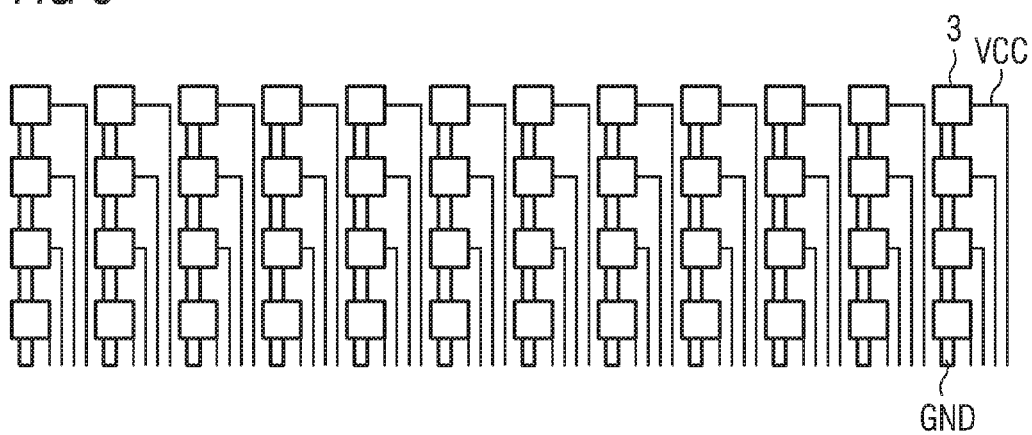
FIG. 6 shows a modification of an arrangement of semiconductor chips.

FIG. 6 shows a modification. A dedicated voltage line VCC is present for each of the semiconductor chips 3. An increased circuit outlay is thus required in the case of such an arrangement, in comparison with FIG. 4, for instance.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An adaptive headlight for a motor vehicle, the headlight comprising: a mounting platform; and a plurality of optoelectronic semiconductor components, each optoelectronic semiconductor component comprising: a carrier having a carrier top side and a carrier underside; a plurality of active zones, which are located at the carrier top side and which are designed for emitting radiation; at least three electrical contact locations at the carrier underside, wherein the at least three electrical contact locations are designed at least for electrically connecting the semiconductor component; and at least one drive unit for electrically addressing the optoelectronic semiconductor component and for electrically driving the active zones, wherein the active zones are arranged in a regular grid at the carrier top sides, wherein the grid has a grid pitch, wherein geometrical midpoints of radiation main sides of the active zones within the optoelectronic semiconductor components lie on grid points of the grid, wherein a distance between the geometrical midpoints of marginal active zones and a closest edge of the carrier is at most 50% of the grid pitch, wherein the semiconductor components are arranged on the mounting platform in such a way that all the active zones of the optoelectronic semiconductor components, with a tolerance of at most 20% of the grid pitch, lie on the grid points of the regular grid, wherein the grid extends uniformly over all the optoelectronic semiconductor components, wherein the optoelectronic semiconductor components are connected to one another via exactly one common data line, wherein individual active zones or groups of active zones of the headlight are drivable independently of one another by the drive unit, and wherein the optoelectronic semiconductor components have a common voltage line and a common ground line.

2. The adaptive headlight according to claim 1, wherein the optoelectronic semiconductor components are surface-mountable, wherein each of the active zones is formed by exactly one optoelectronic semiconductor chip, wherein the optoelectronic semiconductor chips are arranged in accordance with the grid, wherein the grid is a rectangular n×m matrix and has a grid pitch, wherein n and m are natural numbers between 2 and 12 inclusive, wherein each active zone has exactly one geometrical midpoint, and wherein all the geometrical midpoints with a tolerance of at most 5% of the grid pitch lie on the grid points of the grid.

3. The adaptive headlight according to claim 1, wherein a conversion element for partial radiation conversion is disposed downstream of each active zone, in a direction away from the respective carrier, wherein each conversion element completely covers the respective radiation main sides and wherein each conversion element is surrounded all around by a reflector potting.

4. The adaptive headlight according to claim 1, wherein an average distance between adjacent active zones and optoelectronic semiconductor chips is at most 50% of the grid pitch.

5. The adaptive headlight according to claim 1, wherein each carrier is a silicon carrier or a germanium carrier, in which the drive unit is monolithically integrated, and wherein the drive unit comprises a plurality of transistors, based on silicon or germanium.

6. The adaptive headlight according to claim 1, further comprising a layer composed of recrystallized silicon arranged at each carrier top side, the layer forming the drive unit and being situated between the carrier and the respective active zones.

7. The adaptive headlight according to claim 1, wherein each drive unit comprises a serial shift register having a data input and having a plurality of signal outputs, and wherein the signal outputs are electrically conductively connected to switches and each of the switches is electrically connected in parallel with one of the active zones.

8. The adaptive headlight according to claim 1, wherein each optoelectronic semiconductor component comprises exactly one electrical contact pad for the voltage line, exactly one electrical contact pad for a ground line and one or two contact pads for the data line.

9. The adaptive headlight according to claim 1, wherein all the active zones and semiconductor chips emit light of the same color during operation so that the emitted color is not adjustable.

10. The adaptive headlight according to claim 1, wherein a plurality of the active zones have a common growth substrate, and wherein a semiconductor material from which the active zones are constructed is completely or partly removed between adjacent active zones.

11. An adaptive headlight for a motor vehicle, the headlight comprising: a mounting platform; and a plurality of optoelectronic semiconductor components, each optoelectronic semiconductor component comprising: a carrier having a carrier top side and a carrier underside; a plurality of active zones, which are located at the carrier top side and which are designed for emitting radiation; exactly four electrical contact locations at the carrier underside, wherein exactly one electrical contact pad is for a voltage line, exactly one electrical contact pad is for a ground line and two contact pads are for a data line, wherein the two contact pads comprise a data input pad and a data output pad, and wherein the electrical contact locations are designed at least for electrically connecting the semiconductor component; and at least one drive unit for electrically addressing the optoelectronic semiconductor component and for electrically driving the active zones, wherein the at least one drive unit is configured to drive individual active zones, wherein the active zones are arranged in a regular grid at the carrier top sides, wherein the grid has a grid pitch, wherein geometrical midpoints of radiation main sides of the active zones within the optoelectronic semiconductor components lie on grid points of the grid, wherein a distance between the geometrical midpoints of marginal active zones and a closest edge of the carrier is at most 50% of the grid pitch, wherein the semiconductor components are arranged on the mounting platform in such a way that all the active zones of the optoelectronic semiconductor components, with a tolerance of at most 20% of the grid pitch, lie on the grid points of the regular grid, wherein the grid extends uniformly over all the optoelectronic semiconductor components, wherein the optoelectronic semiconductor components are connected to one another via exactly one common data line, wherein the common data line is looped through each individual semiconductor component so that the common data line is not a physical continuous data line, and wherein the optoelectronic semiconductor components have a common voltage line and a common ground line.

* * * * *